(12) United States Patent
Toyomura et al.

(10) Patent No.: US 10,847,407 B2
(45) Date of Patent: Nov. 24, 2020

(54) SUBSTRATE HOLDING APPARATUS

(71) Applicant: EBARA CORPORATION, Tokyo (JP)

(72) Inventors: Naoki Toyomura, Tokyo (JP); Mitsuru Miyazaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/351,242

(22) Filed: Nov. 14, 2016

(65) Prior Publication Data

US 2017/0148660 A1 May 25, 2017

(30) Foreign Application Priority Data

Nov. 19, 2015 (JP) .................. 2015-226775

(51) Int. Cl.
*H01L 21/687* (2006.01)
*H01L 21/67* (2006.01)

(52) U.S. Cl.
CPC .. *H01L 21/68742* (2013.01); *H01L 21/67051* (2013.01); *H01L 21/68728* (2013.01); *H01L 21/68792* (2013.01)

(58) Field of Classification Search
CPC ........... H01L 21/68742; H01L 21/6875; H01L 21/68721; H01L 21/68792; H01L 21/68728; H01L 21/67051
See application file for complete search history.

(56) References Cited

U.S. PATENT DOCUMENTS

| 5,879,576 A * | 3/1999 | Wada ..................... B05C 11/08 156/345.21 |
| 8,293,071 B2 * | 10/2012 | Lee .................. H01L 21/67051 118/728 |
| 2009/0305612 A1 * | 12/2009 | Miyazaki .............. B24B 37/345 451/11 |
| 2014/0197610 A1 * | 7/2014 | Miyazaki .......... H01L 21/68728 279/133 |
| 2014/0373289 A1 * | 12/2014 | Miyazaki .......... H01L 21/67051 15/21.1 |

FOREIGN PATENT DOCUMENTS

| JP | 11-186367 A | 7/1999 |
| JP | 2001-196344 A | 7/2001 |
| JP | 2009-094508 A | 4/2009 |
| JP | 2009-295751 A | 12/2009 |
| JP | 2014-133642 A | 7/2014 |
| JP | 2015-005689 A | 1/2015 |
| TW | I370513 B | 8/2012 |
| TW | I392052 B | 4/2013 |
| TW | I412101 B | 10/2013 |

* cited by examiner

*Primary Examiner* — Orlando E Aviles
*Assistant Examiner* — Seahee Hong
(74) *Attorney, Agent, or Firm* — BakerHostetler

(57) ABSTRACT

A substrate holding apparatus that can minimize a deflection amount of a substrate due to its own weight and can suppress vibration of the substrate at the time of rotation of the substrate even if a diameter of the substrate becomes large is disclosed. The substrate holding apparatus holds a periphery of a substrate and rotates the substrate. The substrate holding apparatus includes a plurality of support posts supported by a base and vertically movable relative to the base, a plurality of chucks respectively provided on the plurality of support posts and configured to hold the periphery of the substrate, and at least one support pin configured to support a lower surface of the substrate held by the plurality of chucks.

8 Claims, 14 Drawing Sheets

SUBSTRATE HOLDING APPARATUS

CROSS REFERENCE TO RELATED APPLICATION

This document claims priority to Japanese Patent Application Number 2015-226775 filed Nov. 19, 2015, the entire contents of which are hereby incorporated by reference.

BACKGROUND

In a manufacturing process of semiconductor devices, a surface of a substrate such as a semiconductor wafer is subjected to various processes, e.g., deposition, etching, and polishing. In order to clean the substrate after such processes, the substrate to which these various processes have been applied is subjected to a cleaning process and a drying process of the substrate. For example, in the cleaning process of the substrate, while the substrate is held and rotated, a cleaning liquid is supplied onto the substrate to clean the substrate. In the drying process of the substrate, the substrate is held and rotated at a high speed to be spin-dried, or while the substrate is held and rotated, IPA vapor or the like is sprayed onto the surface of the substrate to dry the substrate.

In order to perform such cleaning process and drying process of the substrate, as disclosed in Japanese Laid-open Patent Publication No. 2009-295751, there has been known a substrate holding apparatus that holds a periphery of a substrate by chucks and rotates the substrate.

Semiconductor wafers (silicon wafers) used in manufacturing processes of semiconductor devices have been becoming larger in their diameters, from 300 mm to 450 mm. There is a problem that wafers are frequently broken in a drying process where a wafer having a diameter of 450 mm is held and rotated at a high speed using a substrate holding apparatus as disclosed in Japanese Laid-open Patent Publication No. 2009-295751.

The inventors of the present invention have conducted various experiments to investigate causes of wafer breakage that occurs frequently in the case of large diameter wafers, and obtained the following knowledge.

That is, because the substrate holding apparatus disclosed in Japanese Laid-open Patent Publication No. 2009-295751 has a configuration to hold the periphery of the wafer by four chucks arranged at intervals in a circumferential direction of the wafer and to rotate the wafer at a high speed, in the case of a large diameter wafer with a diameter of 450 mm, distances between adjacent chucks become large to cause a problem that a deflection amount due to the own weight of the wafer is increased.

Also, when the wafer is rotated at a high speed for spin-drying, there is a problem that the rotational speed of the wafer approaches a natural frequency of the wafer in the case where the periphery of the wafer is supported at four points with equal intervals, and thus vibration of the wafer is increased.

SUMMARY OF THE INVENTION

According to an embodiment, there is provided a substrate holding apparatus that can minimize a deflection amount of a substrate such as a wafer due to its own weight and can suppress vibration of the substrate at the time of rotation of the substrate even if a diameter of the substrate becomes large.

Embodiments, which will be described below, relate to a substrate holding apparatus for holding a periphery of a substrate such as a semiconductor wafer and rotating the substrate.

In an embodiment, there is provided a substrate holding apparatus for holding a periphery of a substrate and rotating the substrate, the substrate holding apparatus comprising: a plurality of support posts supported by a base and vertically movable relative to the base; a plurality of chucks respectively provided on the plurality of support posts and configured to hold the periphery of the substrate; and at least one support pin configured to support a lower surface of the substrate held by the plurality of chucks.

According to the embodiment, since the support pin for supporting the substrate from underneath is provided, even if a diameter of the substrate becomes large, a deflection amount of the substrate due to its own weight can be minimized. Also, a natural frequency of the substrate whose periphery is being held by the plurality of chucks can be varied by supporting the lower surface of the substrate by the at least one support pin.

In an embodiment, the at least one support pin comprises a plurality of support pins provided at intervals in a circumferential direction of a circle centered at a center of the base.

In an embodiment, the plurality of chucks are arranged at intervals in a circumferential direction of a circle centered at a center of the base, and each of the plurality of support pins is arranged between adjacent two of the plurality of chucks.

In an embodiment, the support pin has an upper end portion which has a hemispherical surface shape.

According to the embodiment, since the upper end portion of the support pin has a hemisphere surface shape, a tip of the hemisphere surface of the support pin can support the substrate by point contact with the lower surface of the substrate.

In an embodiment, the support pin is fixed to the base.

In an embodiment, a natural frequency of the substrate whose periphery is being held by the plurality of chucks is varied by supporting the lower surface of the substrate by the at least one support pin.

According to the substrate holding apparatus of the above-described embodiments, even if the diameter of the substrate such as a wafer becomes large, a deflection amount of the substrate due to its own weight can be minimized, and vibration of the substrate at the time of rotation of the substrate can be suppressed. Therefore, even if the substrate is rotated at a high speed for drying, the substrate can be prevented from being broken.

DESCRIPTION OF EMBODIMENTS

A substrate holding apparatus according to embodiments will now be described with reference to FIGS. 1 through 15.

Figure 1:
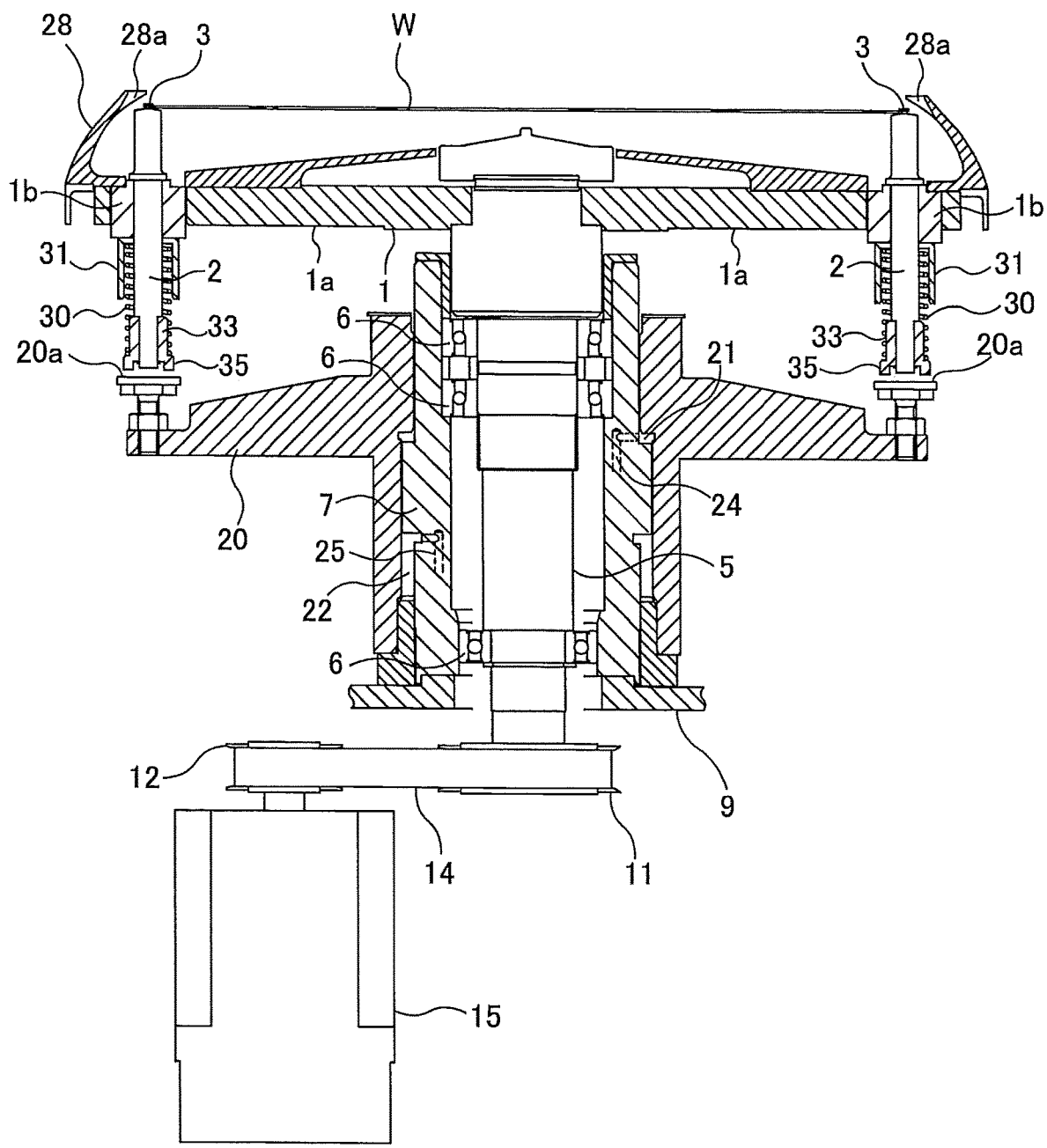
FIG. 1 is a vertical cross-sectional view showing the overall arrangement of a substrate holding apparatus according to an embodiment.
Figure 2:
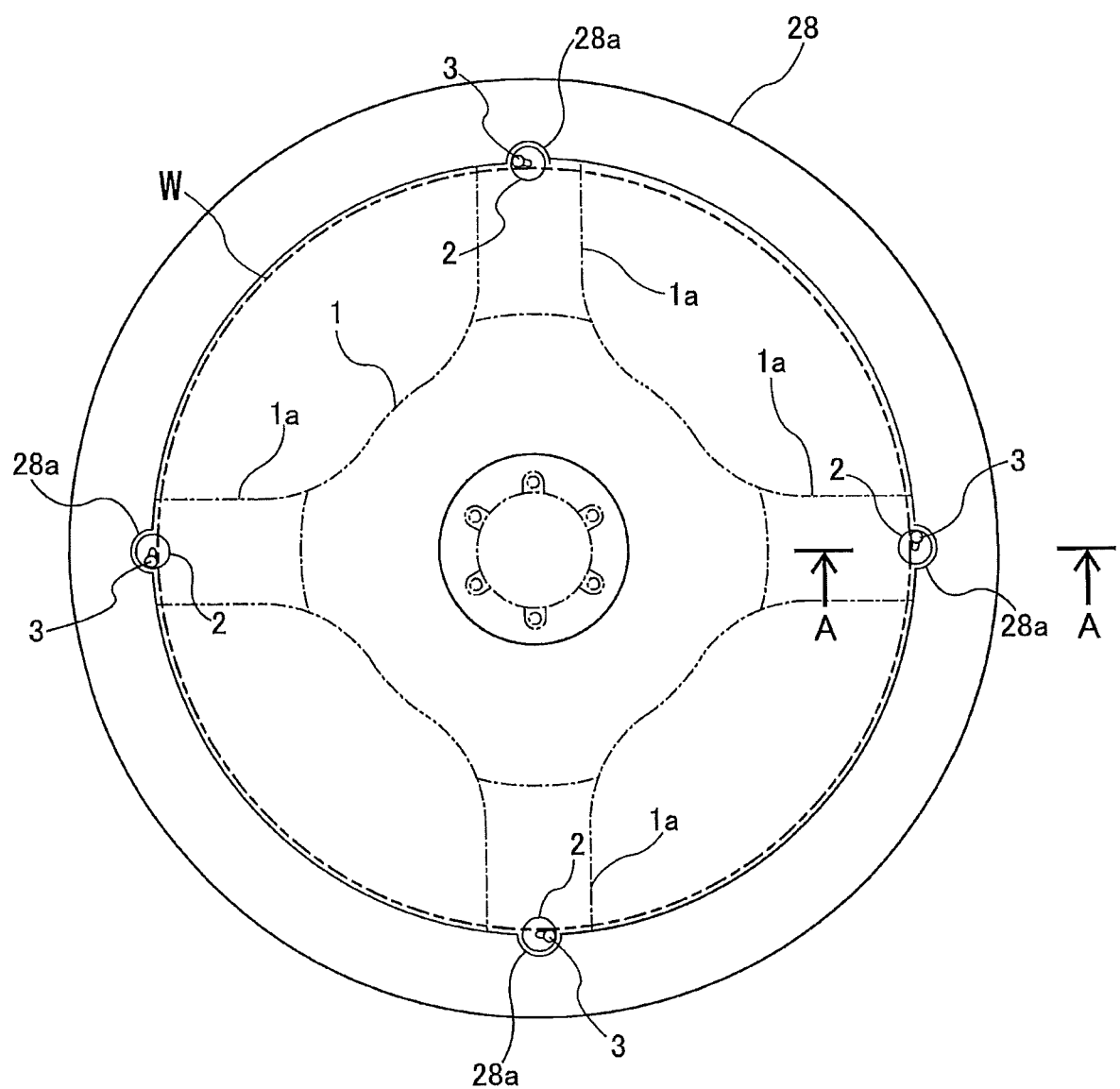
FIG. 2 is a plan view showing the substrate holding apparatus shown in FIG. 1.

FIG. 1 is a vertical cross-sectional view showing the overall arrangement of a substrate holding apparatus according to an embodiment. FIG. 2 is a plan view showing the substrate holding apparatus shown in FIG. 1.

As shown in FIGS. 1 and 2, the substrate holding apparatus includes a base 1 having four arms 1a, four support posts 2 supported by distal ends of the arms 1a, respectively, and four chucks 3 provided on upper ends of the support posts 2, respectively. Each of the support posts 2 is movable upwardly and downwardly relative to the base 1, and is rotatable about its own axis. The support posts 2 are provided with the chucks 3 for holding a periphery of a wafer W which is an example of a substrate. The support posts 2 and the chucks 3 are arranged at equal intervals on a circumference of a circle centered at the center of the base 1. That is, the support posts 2 and the chucks 3 are arranged at equal intervals along the periphery of the wafer W.

The base 1 is secured to an upper end of a rotational shaft 5, which is rotatably supported by bearings 6. The bearings 6 are fixed to an inner circumferential surface of a cylindrical member 7 that surrounds the rotational shaft 5. A lower end of the cylindrical member 7 is mounted on a pedestal 9, and the cylindrical member 7 is fixed in its position. The rotational shaft 5 is coupled to a motor 15 through pulleys 11, 12 and a belt 14 so that the base 1 is rotated about its axis when the motor 15 is set in motion. The wafer W is held by the chucks 3 and rotated about its central axis of the wafer W by the motor 15.

A lifter 20 for elevating the support posts 2 is provided around the cylindrical member 7. This lifter 20 is configured to be slidable vertically relative to the cylindrical member 7. The lifter 20 has four pushers 20a that elevate the four support posts 2, respectively. A first gas chamber 21 and a second gas chamber 22 are formed between an outer circumferential surface of the cylindrical member 7 and an inner circumferential surface of the lifter 20. The first gas chamber 21 and the second gas chamber 22 communicate with a first gas flow passage 24 and a second gas flow passage 25, respectively. The first gas flow passage 24 and the second gas flow passage 25 are coupled to a pressurized gas supply source (not shown).

Figure 3:
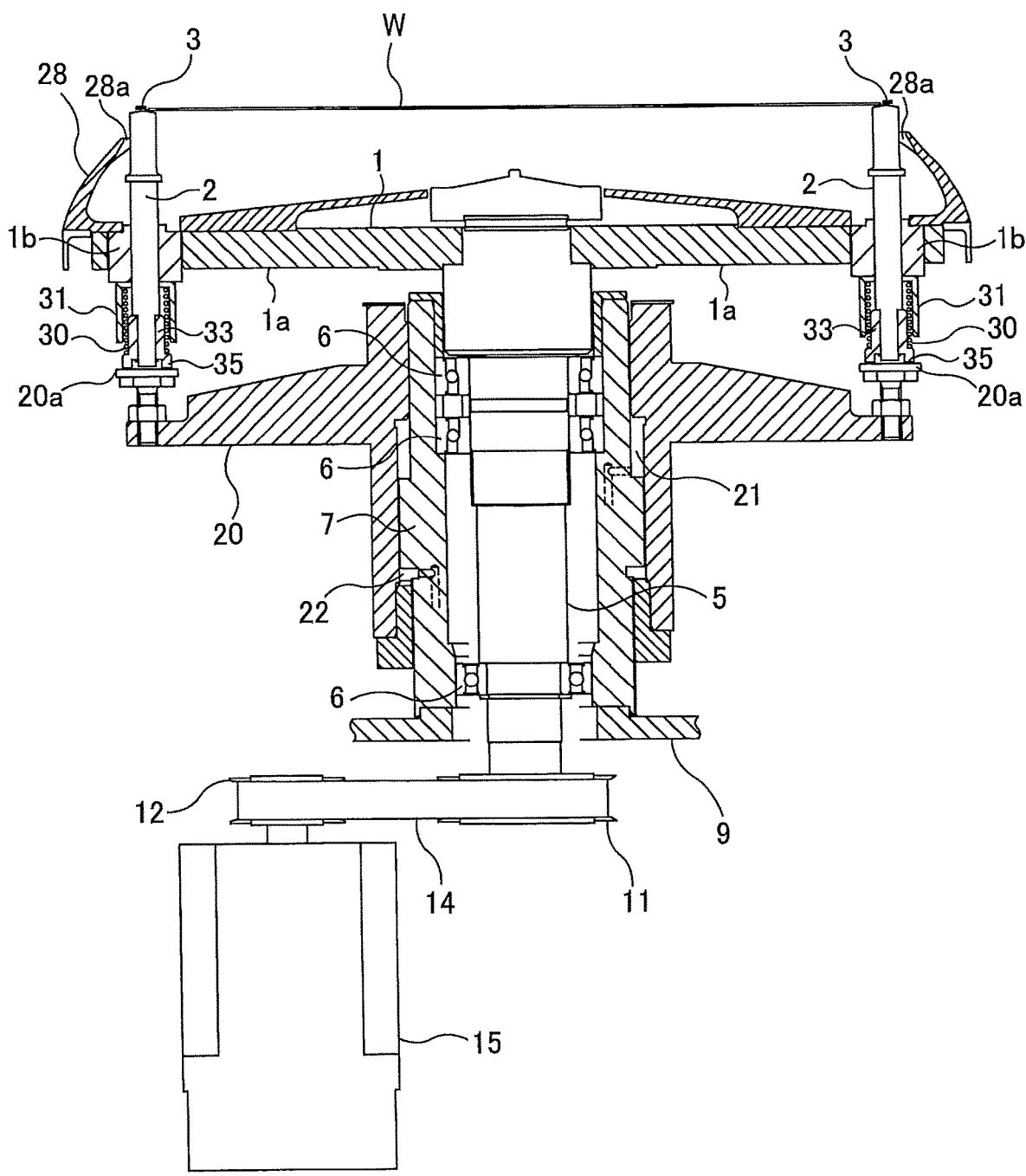
FIG. 3 is a vertical cross-sectional view showing the substrate holding apparatus, shown in FIG. 1, where its support posts are elevated by a lifter.

FIG. 3 is a vertical cross-sectional view showing the substrate holding apparatus, shown in FIG. 1, where its support posts are elevated by the lifter. When a pressure in the first gas chamber 21 is increased higher than that in the second gas chamber 22, the lifter 20 is moved upward as shown in FIG. 3. Conversely, when the pressure in the second gas chamber 22 is increased higher than that in the first gas chamber 21, the lifter 20 is moved downward as shown in FIG. 1. The lifter 20 can cause the four support posts 2 and the four chucks 3 to move up and down simultaneously.

A rotary cup 28 is secured to an upper surface of the base 1. This rotary cup 28 is provided for receiving a liquid, which has been scattered around by a centrifugal force, from the rotating wafer W. As shown in FIG. 1, the rotary cup 28 is arranged so as to surround an entire circumference of the wafer W. The rotary cup 28 has a vertical cross-sectional shape that is inclined radially inwardly. Further, the rotary cup 28 has an inner circumferential surface that is formed by a smooth curved surface. An upper edge of the rotary cup 28 lies close to the wafer W, and an inner diameter of the upper edge of the rotary cup 28 is slightly larger than a diameter of the wafer W. Cutout portions 28a, each having a shape conforming to a shape of a peripheral surface of each support post 2, are formed in the upper edge of the rotary cup 28. Obliquely extending drain holes (not shown) are formed in a bottom of the rotary cup 28. As shown in FIG. 3, when the lifter 20 is elevated, the support posts 2 and the chucks 3 are elevated to allow the wafer W to be located above the upper edge of the rotary cup 28.

Figure 4:
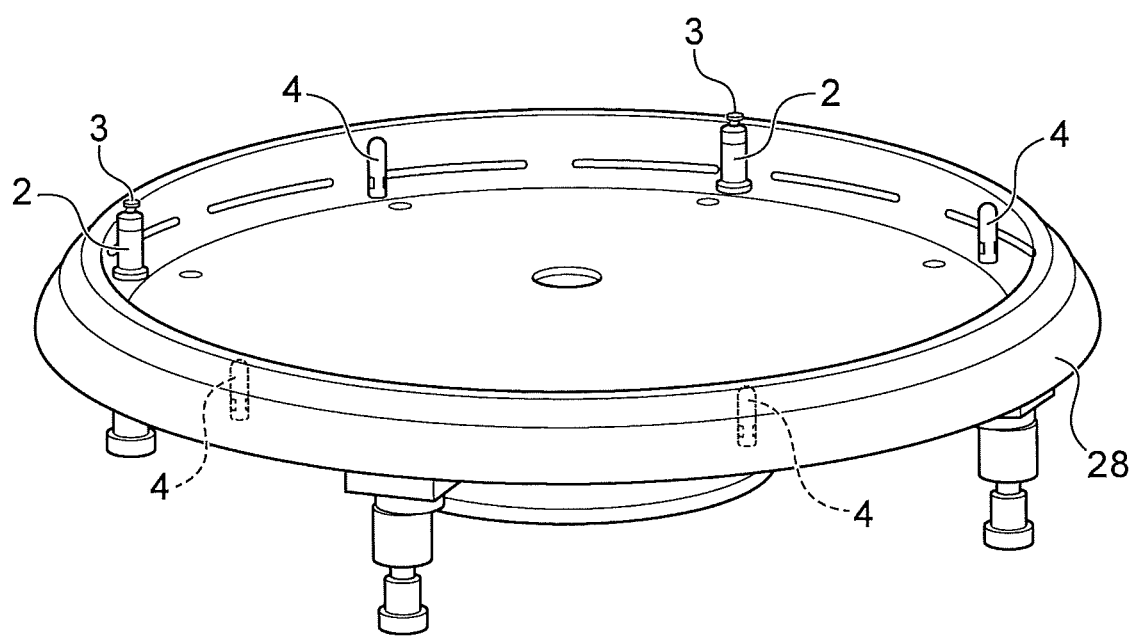
FIG. 4 is a perspective view of the substrate holding apparatus having support pins for supporting a substrate from underneath.
Figure 5:
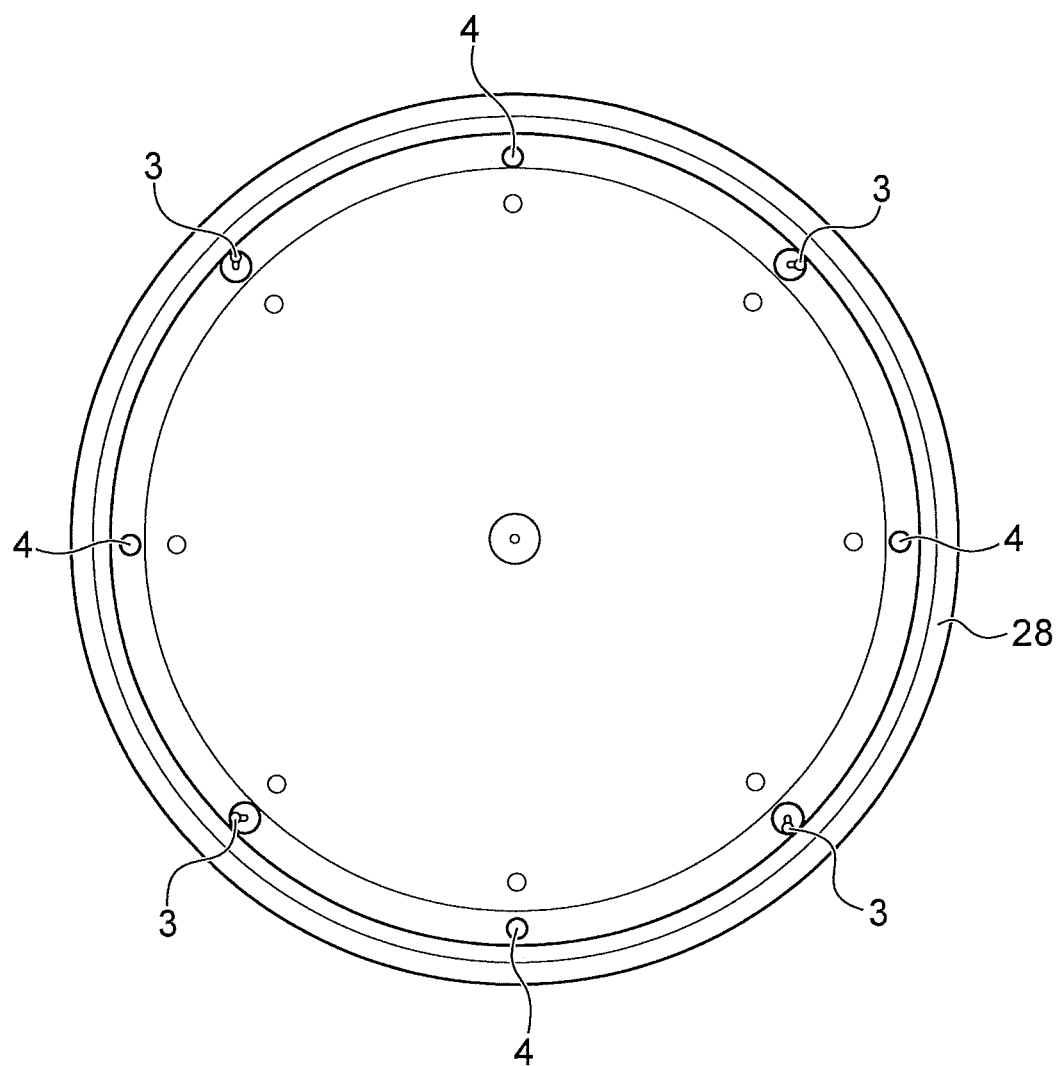
FIG. 5 is a plan view of the substrate holding apparatus.
Figure 6:
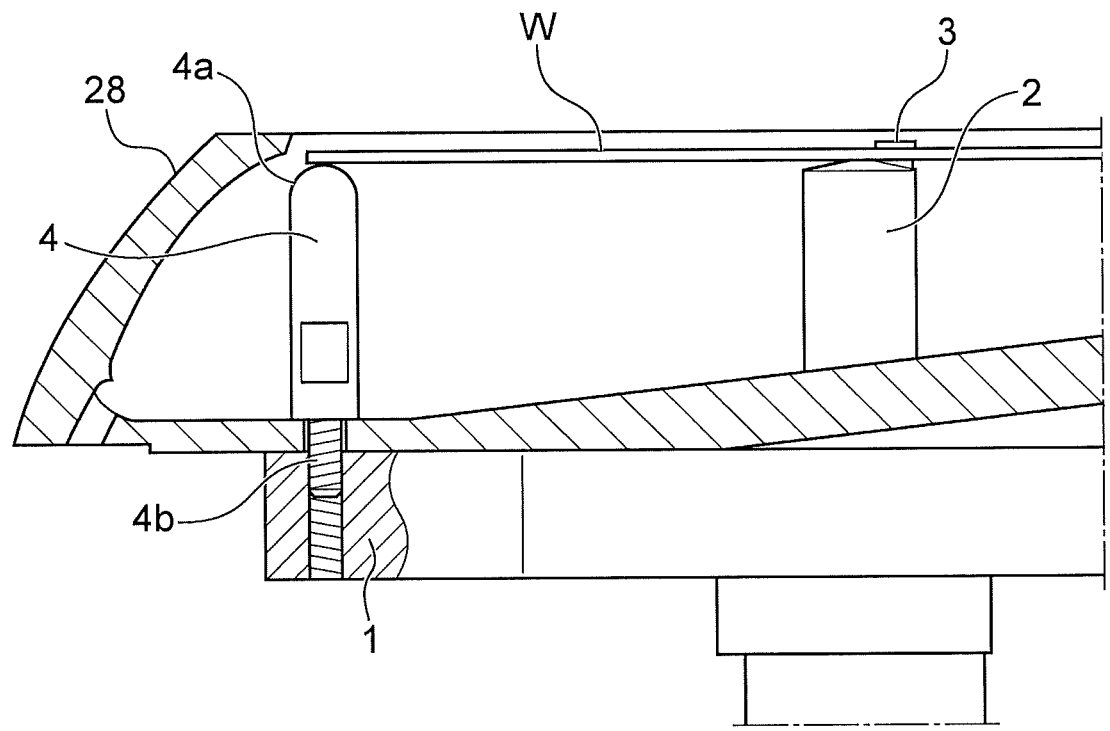
FIG. 6 is a vertical cross-sectional view of a main part of the substrate holding apparatus.

FIGS. 4 through 6 are views of the substrate holding apparatus having support pins 4, provided between the adjacent chucks 3, 3, for supporting the wafer W from underneath. FIG. 4 is a perspective view of the substrate holding apparatus, FIG. 5 is a plan view of the substrate holding apparatus, and FIG. 6 is a vertical cross-sectional view of a main part of the substrate holding apparatus.

As shown in FIGS. 4 and 5, the substrate holding apparatus is provided with the support pins 4, between the adjacent chucks 3, 3, for supporting the wafer W from underneath. Specifically, between the four chucks 3, there are arranged four vertically-extending support pins 4, respectively, at intervals on a circumference of a circle centered at the center of the base 1. The four support pins 4 are located on the circumference which is slightly radially inside a circumference on which the four chucks 3 are located.

FIG. 6 is a vertical cross-sectional view showing one of the support pins 4 provided in the substrate holding apparatus. As shown in FIG. 6, the support pin 4 is formed in a rod-shape overall, and has an upper end portion comprising a hemisphere surface 4a and a lower end portion comprising a threaded portion 4b. The threaded portion 4b is screwed into the base 1, whereby the support pin 4 is fixed to the base 1. The tip of the hemisphere surface 4a of the support pin 4 is configured to support the wafer W by point contact with a lower surface of the wafer W. A height of the tip of the hemisphere surface 4a of the support pin 4 is set to be substantially equal to or slightly lower than a height of the lower surface of the peripheral portion of the wafer W which is held in a horizontal attitude by the four chucks 3. Specifically, the tips of the hemisphere surfaces 4a of the four support pins 4 are set to be at a height lower than the lower surface of the peripheral portion of the wafer W by 0 mm to 0.1 mm.

According to the substrate holding apparatus of the embodiment, as shown in FIGS. 4 to 6, since the support pins 4 for supporting the wafer W from underneath are provided between the adjacent chucks 3, 3, even if a diameter of the wafer becomes larger, a deflection amount due to the own weight of the wafer can be minimized.

In addition to supporting the periphery of the wafer by four points at equal intervals, since the lower surface of the peripheral portion of the wafer W is supported by the support pins 4, a natural frequency of the wafer can be changed. Therefore, even in the case where the wafer W is rotated at a high speed, e.g., at a speed of 1500 to 3000 $min^{-1}$, to spin-dry the wafer W, a rotational speed of the wafer does not approach the natural frequency of the wafer, and thus vibration of the wafer can be suppressed.

Figure 7A:
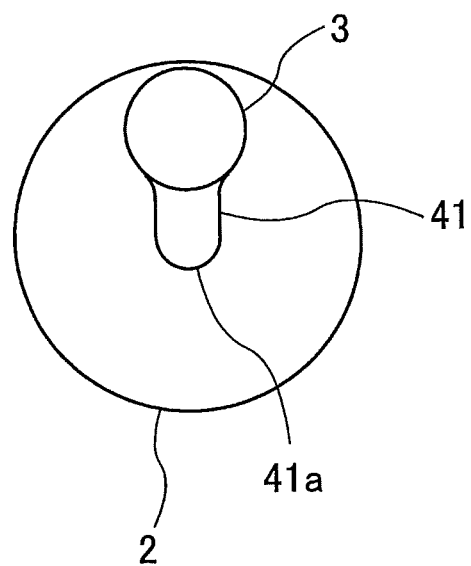
FIG. 7A is a plan view showing a chuck.
Figure 7B:
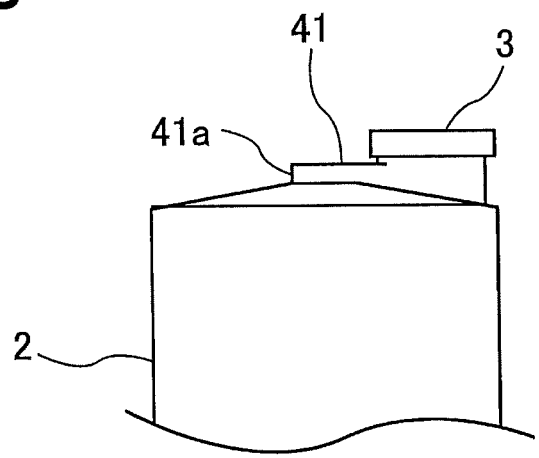
FIG. 7B is a side view showing the chuck.

FIG. 7A is a plan view showing the chuck 3, and FIG. 7B is a side view of the chuck 3. The chuck 3 is formed at an eccentric position on the upper end of the support post 2. This chuck 3 is configured to come into contact with the periphery of the wafer W to thereby hold the periphery of the wafer W. A positioning portion 41, extending from the chuck 3 to the central axis of the support post 2, is formed on the upper end of the support post 2. One end of the positioning portion 41 is connected integrally to a side surface of the chuck 3, and the other end is located on the central axis of the support post 2. This center-side end of the positioning portion 41 has a side surface 41a that is curved along a circle which is concentric with the support post 2. The upper end of the support post 2 has a tapered surface inclined downwardly.

Figure 8A:
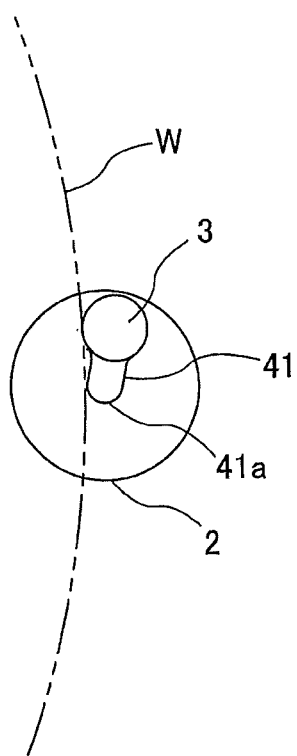
FIG. 8A is a plan view showing the state where the chuck holds a wafer.
Figure 8B:
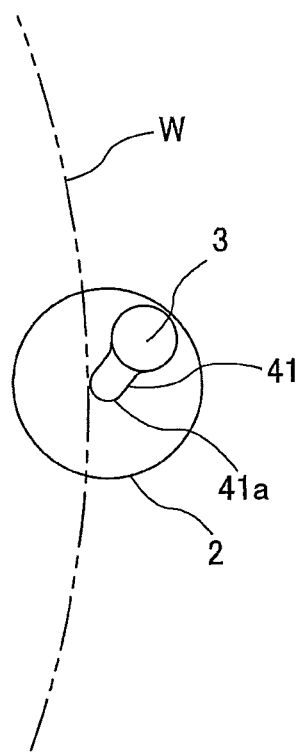
FIG. 8B is a plan view showing the state where the chuck has released the wafer.

FIG. 8A is a plan view showing the state where the chuck 3 holds the wafer W, and FIG. 8B is a plan view showing the state where the chuck 3 has released the wafer W. The wafer W is placed on the upper end (the tapered surface) of each support post 2. When the support post 2 is rotated in one direction, the chuck 3 is brought into contact with the periphery of the wafer W to thereby hold the wafer W, as shown in FIG. 8A. When the support post 2 is rotated in the opposite direction, the chuck 3 is separated from the wafer W to thereby release the wafer W, as shown in FIG. 8B. At this time, the periphery of the wafer W is placed in contact with the side surface 41a of the center-side end of the positioning portion 41. This side surface 41a of the positioning portion 41 can restrict a displacement of the wafer W which can occur when the support post 2 rotates. As a result, the stability of subsequent wafer transferring operations can be improved.

Figure 9:
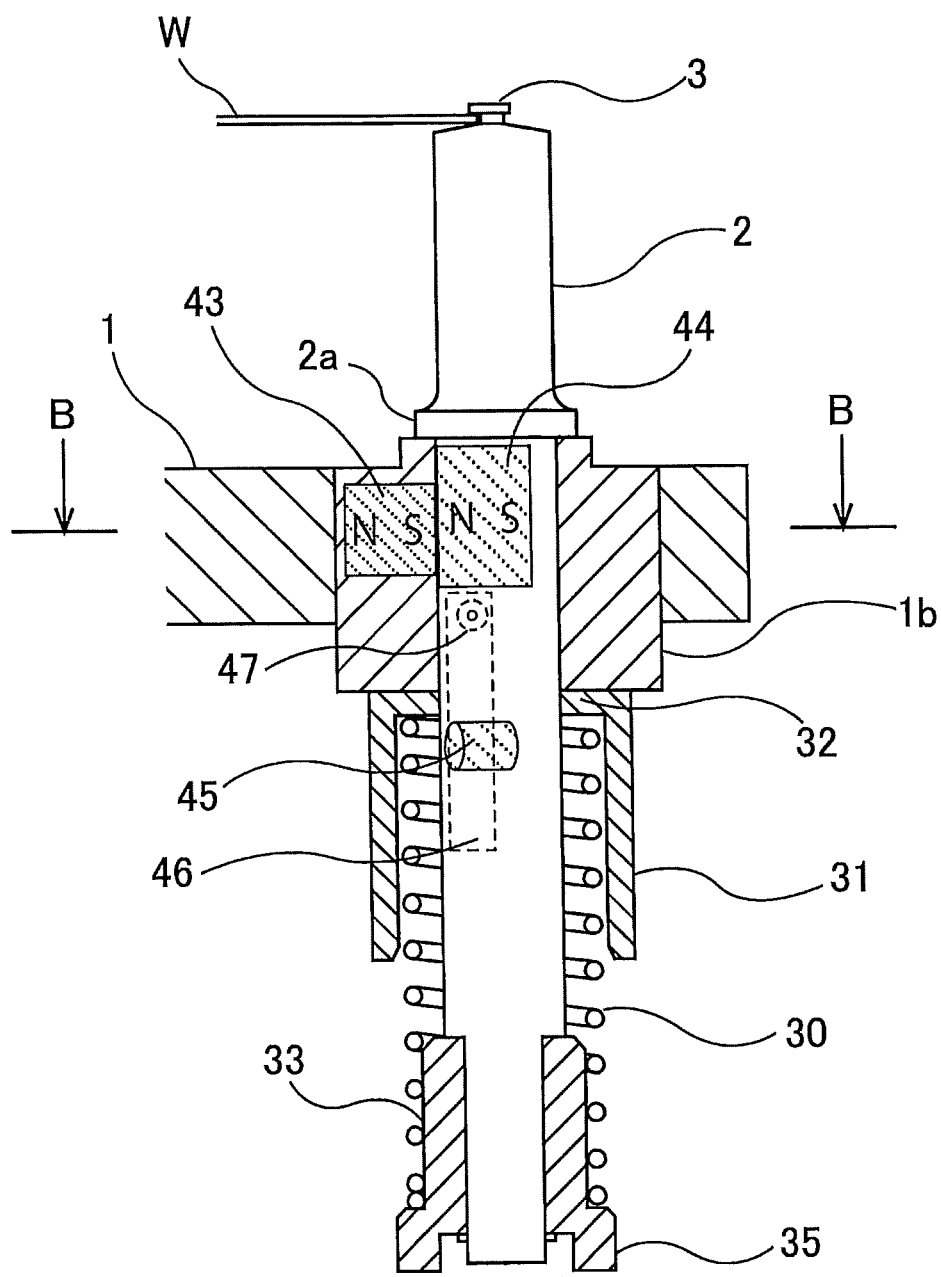
FIG. 9 is a cross-sectional view taken along line A-A of FIG. 2.
Figure 10:
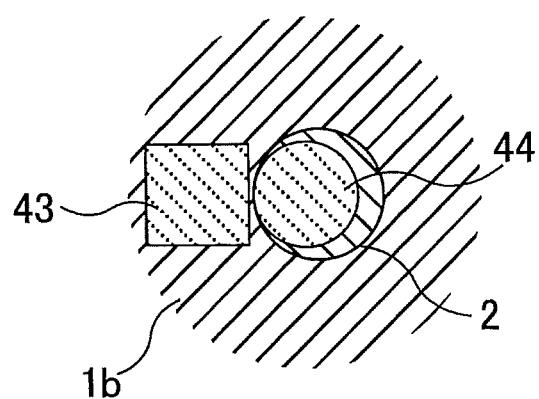
FIG. 10 is a cross-sectional view taken along line B-B of FIG. 9.

FIG. 9 is a cross-sectional view taken along line A-A of FIG. 2, and FIG. 10 is a cross-sectional view taken along line B-B of FIG. 9. The depiction of the rotary cup 28 is omitted from FIGS. 9 and 10. Each of the arms 1a of the base 1 has a holding member 1b for slidably holding the support post 2. This holding member 1b may be formed integrally with the arm 1a. The holding member 1b has a vertically-extending through-hole in which the support post 2 is inserted. A diameter of the through-hole is slightly larger than that of the support post 2, so that the support post 2 can move vertically relative to the base 1 and can rotate about its axis.

The substrate holding apparatus has springs 30 for biasing the support posts 2 in their axial directions. Outer covers 31 are mounted respectively to lower surfaces of the holding members 1b of the base 1. Each outer cover 31 has an inner circumferential surface that surrounds an upper portion of each spring 30. In this embodiment, the outer cover 31 is disposed so as to surround an upper half of the spring 30. The upper end of the spring 30 is in contact with an inner flange 32 formed at the upper end of the outer cover 31. The inner flange 32 may be omitted. In that case, the upper end of the spring 30 is in contact with the lower surface of the holding member 1b of the base 1. A diameter of the inner circumferential surface of the outer cover 31 may be equal to or slightly larger than an outer diameter of the spring 30. In this embodiment, the diameter of the inner circumferential surface of the outer cover 31 is slightly larger than the outer diameter of the spring 30.

Inner collars 33 are mounted on lower portions of the support posts 2, respectively. Each of the inner collars 33 is a member having a cylindrical shape. Each spring 30 is disposed so as to surround each support post 2 and each inner collar 33. The inner collar 33 is disposed inside the spring 30 and has an outer circumferential surface that supports a lower portion of the spring 30. A diameter of the outer circumferential surface of the inner collar 33 may be equal to or slightly smaller than an inner diameter of the spring 30. In this embodiment, the diameter of the outer circumferential surface of the inner collar 33 is equal to the inner diameter of the spring 30, so that the outer circumferential surface of the inner collar 33 is in contact with the lower portion of the spring 30. Further, the diameter of the outer circumferential surface of the inner collar 33 is larger than that of the peripheral surface of the support post 2. The outer cover 31 and the inner collar 33 are made of a resin having high abrasion resistance. For example, the outer cover 31 and the inner collar 33 are made of PTFE (polytetrafluoroethylene).

Spring stoppers 35 are connected to lower ends of the inner collars 33, respectively. In this embodiment, the spring stoppers 35 are formed integrally with the inner collars 33. In one embodiment, the inner collars 33 and the spring stoppers 35 may be different members. The support post 2 is coupled to the inner collar 33 so as to be rotatable about its own axis. More specifically, the support post 2 is rotatable relative to the inner collar 33 and the spring stopper 35.

The upper end of the spring 30 presses the holding member 1b of the base 1, while the lower end of the spring 30 presses the spring stopper 35 coupled to the support post 2. Therefore, the spring 30 in this embodiment biases the support post 2 downwardly. A support post stopper 2a, having a diameter larger than the diameter of the through-hole of the holding member 1b, is formed on the peripheral surface of the support post 2. This support post stopper 2a is located above the holding member 1b of the base 1. Therefore, as shown in FIG. 9, a downward movement of the support post 2 is restricted by the support post stopper 2a.

A first magnet 43 is embedded in the holding member 1b of the base 1. A second magnet 44 and a third magnet 45 are provided in the support post 2. The second magnet 44 and the third magnet 45 are arranged away from each other in the vertical direction. The first, second, and third magnets 43, 44, and 45 may be neodymium magnets.

Figure 11:
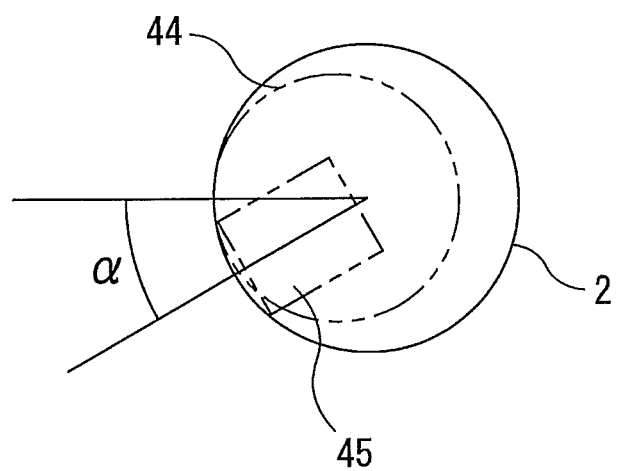
FIG. 11 is a schematic view illustrating an arrangement of a second magnet and a third magnet as viewed in an axial direction of a support post.

FIG. 11 is a schematic view showing the arrangement of the second magnet 44 and the third magnet 45, as viewed from the axial direction of the support post 2. As shown in FIG. 11, the second magnet 44 and the third magnet 45 are arranged in different positions with respect to the circumferential direction of the support post 2. Specifically, a line interconnecting the center of the second magnet 44 and the center of the support post 2 and a line interconnecting the center of the third magnet 45 and the center of the support post 2 intersect at a predetermined angle a as viewed from the axial direction of the support post 2.

When the support post 2 is in a lowered position shown in FIG. 9, the second magnet 44 is close to the first magnet 43, while the third magnet 45 is away from the first magnet 43. As a result, an attractive force acts between the first magnet 43 and the second magnet 44. This attractive force generates a force to rotate the support post 2 about its central axis in a direction such that the chuck 3 presses the periphery of the wafer W. Accordingly, the lowered position shown in FIG. 9 is a clamp position at which the wafer W is held (clamped).

Figure 12:
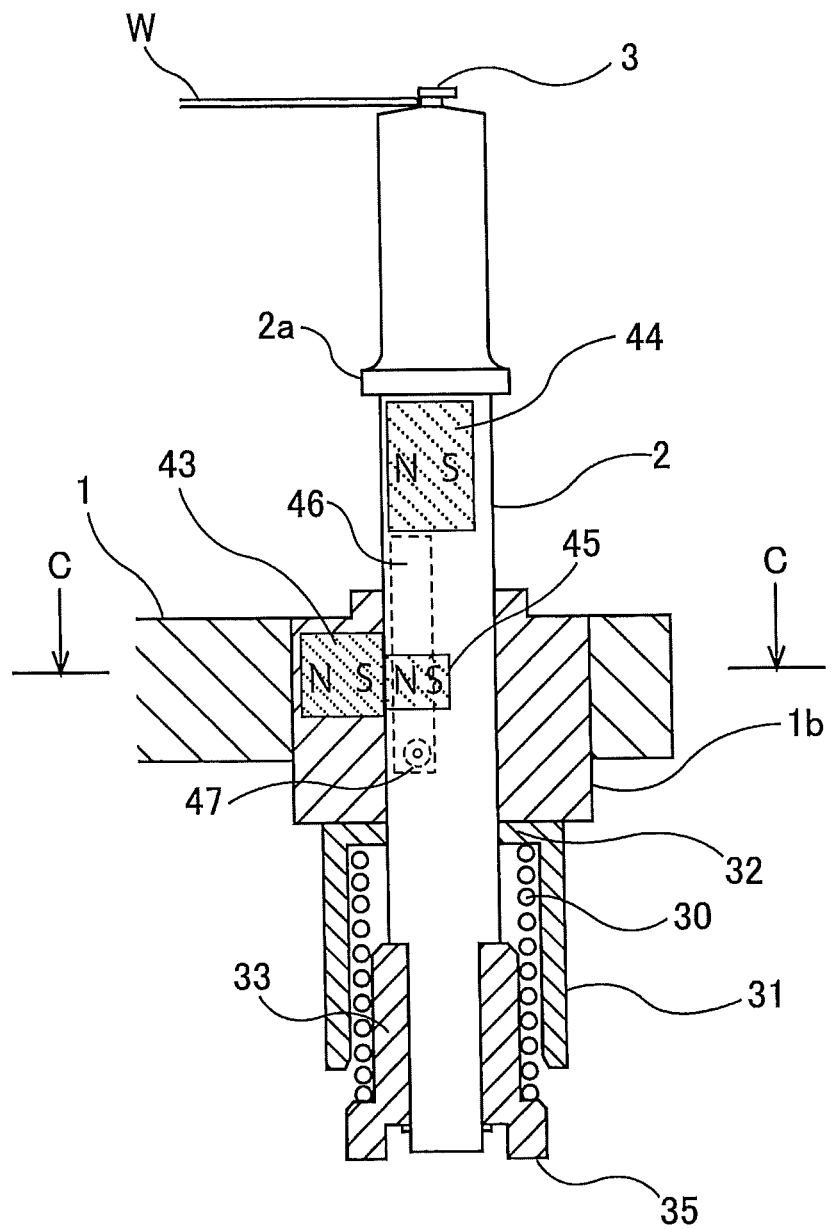
FIG. 12 is a cross-sectional view taken along line A-A of FIG. 2, when a support post has been elevated by the lifter.
Figure 13:
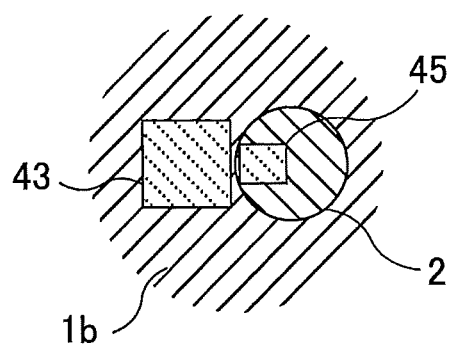
FIG. 13 is a cross-sectional view taken along line C-C of FIG. 12.

FIG. 12 is a cross-sectional view taken along line A-A of FIG. 2 when the support post 2 is elevated by the lifter 20, and FIG. 13 is a cross-sectional view taken along line C-C of FIG. 12. When the support post 2 is elevated by the lifter 20 to an elevated position shown in FIG. 12, the third magnet 45 is close to the first magnet 43, while the second magnet 44 is away from the first magnet 43, as shown in FIGS. 12 and 13. As a result, an attractive force acts between the first magnet 43 and the third magnet 45. This attractive force generates a force to rotate the support post 2 about its central axis in a direction such that the chuck 3 moves away from the wafer W. Accordingly, the elevated position shown in FIG. 12 is an unclamp position at which the substrate is released (unclamped).

Because the second magnet 44 and the third magnet 45 are arranged in different positions with respect to the circumferential direction of the support post 2, the rotating force acts on the support post 2 as the support post 2 moves up and down. This rotating force imparts a force of holding the wafer W and a force of releasing the wafer W to the chuck 3. Therefore, by just moving the support post 2 vertically, the chuck 3 can hold and release the wafer W. In this manner, the first magnet 43, the second magnet 44, and the third magnet 45 serve as a rotating mechanism for rotating the support post 2 and the chuck 3 about the central axis of the support post 2. This rotating mechanism is actuated by the vertical movement of the support post 2.

When the support post 2 is elevated by the lifter 20, the pusher 20a of the lifter 20 comes into contact with the spring stopper 35. Since the support post 2 is rotatable independently of the spring stopper 35, the support post 2 can rotate smoothly about its axis while moving upward. On the other hand, the spring stopper 35 and the inner collar 33 do not rotate. As shown in FIG. 12, when the support post 2 is elevated against the force of the spring 30, the inner collar 33 comes to be accommodated or inserted in the outer cover 31. A cylindrical space is formed between the outer circumferential surface of the inner collar 33 and the inner circumferential surface of the outer cover 31, and the compressed spring 30 is accommodated in this cylindrical space. The lifter 20 is a moving mechanism that moves the support post 2 in its axial direction against the force of the spring 30.

A groove 46, extending along the axis of the support post 2, is formed in the side surface of the support post 2. The groove 46 has an arc-shaped horizontal cross section. The holding member 1b of the base 1 has a protruding portion 47 that protrudes toward the groove 46. A distal end of the protruding portion 47 lies in the groove 46, and the protruding portion 47 is in loose engagement with the groove 46. The groove 46 and the protruding portion 47 are provided to restrict an angle of rotation of the support post 2.

As shown in FIG. 3, when the support posts 2 are elevated, the wafer W is elevated to a position higher than the rotary cup 28 and the chucks 3 are separated away from the periphery of the wafer W. Therefore, a transporting device (not shown) such as a transfer robot can remove the wafer W from the substrate holding apparatus.

When the support posts 2 are at the lowered position shown in FIG. 1, the wafer W is rotated by the motor 15. When the wafer W is being rotated, a centrifugal force acts on each spring 30. Especially when the wafer W is rotated at a high speed (e.g. at a speed of 1500 to 3000 $min^{-1}$), a large centrifugal force acts on each spring 30, causing the spring 30 to deform outwardly. Such deformation fatigues the spring 30, and as a result, the spring 30 may be broken sooner than expected.

In order to prevent the outward deformation of the spring 30, the outer cover 31 is provided outside the spring 30 and the inner collar 33 is provided inside the spring 30 as shown in FIG. 9. The outer cover 31 serves as a first structure that restricts a movement (or a displacement) of the upper portion of the spring 30 in a direction perpendicular to the axial direction of the support post 2, and the inner collar 33 serves as a second structure that restricts a movement (or a displacement) of the lower portion of the spring 30 in a direction perpendicular to the axial direction of the support post 2.

When the wafer W is rotating, the upper portion of the spring 30 is supported from outside by the outer cover 31, and the lower portion of the spring 30 is supported from inside by the inner collar 33. Accordingly, even when a strong centrifugal force acts on the spring 30, the outward deformation of the spring 30, i.e., the movement of the spring 30 in a direction perpendicular to the axial direction of the support post 2, is restricted or limited by the outer cover 31 and the inner collar 33. Therefore, the spring 30 hardly deforms, and no large stress is generated in the spring 30. As a result, unexpected breakage of the spring 30 can be prevented. As shown in FIGS. 3 and 12, when the support post 2 is elevated in order to release the wafer W from the chuck 3, the inner collar 33 is accommodated (or inserted) in the outer cover 31. The inner collar 33 and the outer cover 31 thus do not interfere with the upward movement of the support post 2 and can make the mechanism compact.

Figure 14:
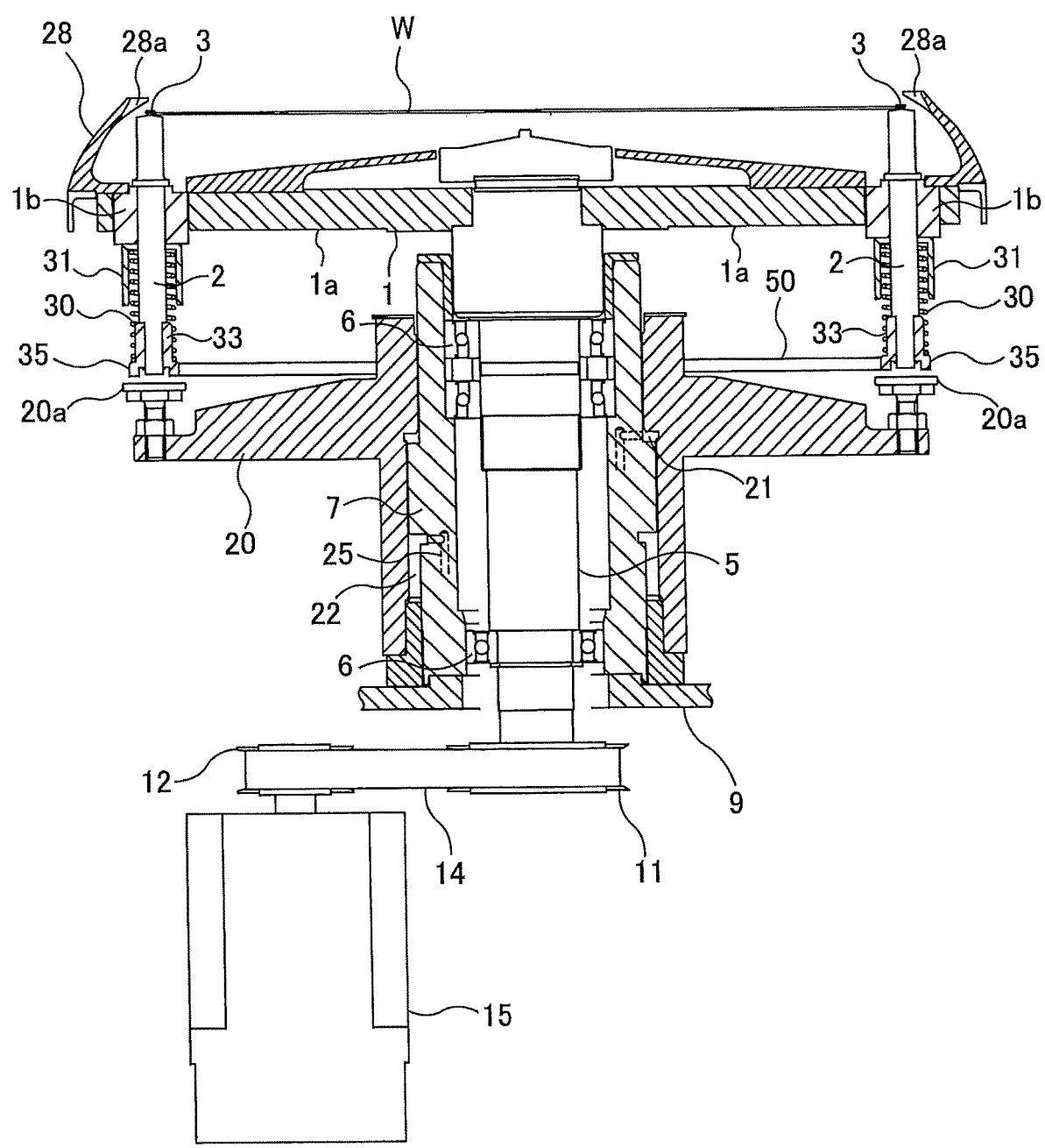
FIG. 14 is a cross-sectional view of the substrate holding apparatus having a coupling ring for coupling lower ends of four support posts together.
Figure 15:
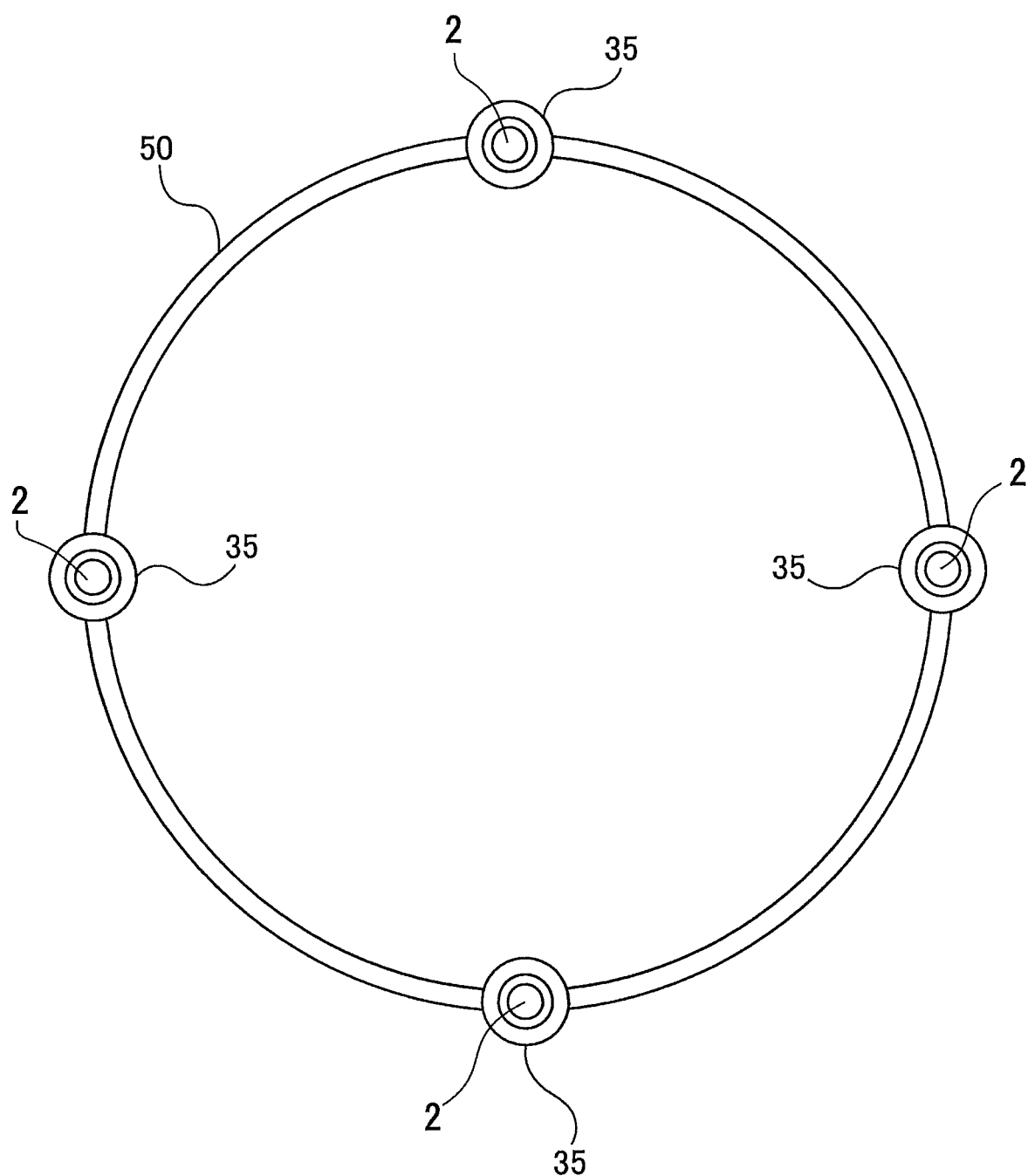
FIG. 15 is a plan view of the substrate holding apparatus having the coupling ring for coupling the lower ends of the four support posts together.

When the wafer W is rotating at a high speed, a strong centrifugal force acts also on each support post 2, possibly causing an outward displacement of the end of the support post 2. As a result, a force for allowing the chuck 3 to hold the wafer W can become unstable. In order to prevent such an outward displacement of the end of the support post 2, a coupling ring 50, which couples the lower ends of the four support posts 2 to each other, is provided as shown in FIGS. 14 and 15. This coupling ring 50 is secured to the spring stoppers 35 mounted on the lower ends of the support posts 2. Thus, the coupling ring 50 is coupled to the support posts 2 through the spring stoppers 35. The coupling ring 50 moves vertically together with the support posts 2, and is rotated together with the support posts 2 which are rotated around the axis of the wafer W by the motor 15. The coupling ring 50 restricts a relative position of the four support posts 2, and can therefore prevent the outward displacement of the ends of the support posts 2 even when strong centrifugal forces act on the support posts 2. Since each support post 2 is supported at its upper and lower portions by the arm 1a and the coupling ring 50, the deformation of the support posts 2 can be prevented when the wafer W is rotating at a high speed.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate holding apparatus for holding a periphery of a substrate and rotating the substrate, the substrate holding apparatus comprising:
a plurality of support posts supported by a base and vertically movable relative to the base;
a lifter coupled to the plurality of support posts, the lifter being configured to vertically move the plurality of support posts between an elevated position and a lowered position;
a plurality of chucks respectively provided on the plurality of support posts and configured to hold the periphery of the substrate;
a plurality of support pins respectively provided at intervals in a circumferential direction of a circle centered at a center of the base;
a coupling ring provided on lower ends of the plurality of support posts and coupled to the lower ends of the plurality of support posts;
wherein the plurality of support pins are vertically and horizontally immovably fixed to the base;
wherein the plurality of chucks are arranged at intervals in a circumferential direction of a circle centered at the center of the base, and each of the plurality of support pins is arranged between adjacent two of the plurality of chucks;
wherein the plurality of support pins are out of contact with the substrate placed on tops of the plurality of support posts in the elevated position, and the plurality of support pins are in contact with a lower surface of the periphery of the substrate held by the plurality of chucks and placed on the tops of the plurality of support posts in the lowered position;
wherein each tip of the plurality of support pins is set to be lower than a height of the lower surface of the substrate which is held in a horizontal attitude by the plurality of chucks; and
wherein the coupling ring is configured to move vertically together with the plurality of support posts and to be rotated together with the plurality of support posts.

2. The substrate holding apparatus according to claim 1, wherein each of the plurality of support pins has an upper end portion which has a hemispherical surface shape.

3. The substrate holding apparatus according to claim 1, wherein the plurality of support pins are configured to support and contact the lower surface of the substrate so that a natural frequency of the substrate whose periphery is being held by the plurality of chucks is varied.

4. The substrate holding apparatus according to claim 1, wherein each of the plurality of chucks is formed at an eccentric position of an upper end of the support posts; and
wherein each of the chucks is configured to be brought into contact with the periphery of the substrate to thereby hold the substrate when each of the support posts is rotated in one direction, and each of the chucks is configured to be separated from the substrate to thereby release the substrate when each of the support posts is rotated in the opposite direction.

5. The substrate holding apparatus according to claim 1, wherein the tips of the plurality of support pins are set to be at a height lower than the lower surface of the substrate by about 0.1 mm. surface shape.

6. The substrate holding apparatus according to claim 1, wherein each tip of the plurality of support pins is set to be at a height lower than the lower surface of the substrate by an amount greater than 0 mm and less than 0.1 mm.

7. A substrate holding apparatus for holding a periphery of a substrate and rotating the substrate, the substrate holding apparatus comprising:
a plurality of support posts supported by a base and vertically movable relative to the base;
a lifter coupled to the plurality of support posts, the lifter being configured to vertically move the plurality of support posts between an elevated position and a lowered position;
a plurality of chucks respectively provided on the plurality of support posts and configured to hold the periphery of the substrate;
a plurality of support pins respectively provided at intervals in a circumferential direction of a circle centered at a center of the base, and configured to suppress vibration of the substrate during rotation of the wafer at high speed;
a coupling ring provided on lower ends of the plurality of support posts and coupled to the lower ends of the plurality of support posts;
wherein the plurality of support pins are vertically and horizontally immovably fixed to the base;
wherein the plurality of chucks are arranged at intervals in a circumferential direction of a circle centered at the center of the base, and each of the plurality of support pins is arranged between adjacent two of the plurality of chucks;
wherein the plurality of support pins are out of contact with the substrate placed on tops of the plurality of support posts in the elevated position, and the plurality of support pins are in contact with a lower surface of the periphery of the substrate held by the plurality of chucks and placed on the tops of the plurality of support posts in the lowered position;
wherein each tip of the plurality of support pins is set to be substantially equal to a height of the lower surface of the substrate which is held in a horizontal attitude by the plurality of chucks; and
wherein the coupling ring is configured to move vertically together with the plurality of support posts and to be rotated together with the plurality of support posts.

8. The substrate holding apparatus according to claim 7, wherein each of the plurality of support pins has an upper end portion which has a hemispherical.

* * * * *